United States Patent [19]

Kamisaki

[11] Patent Number: 5,003,510
[45] Date of Patent: Mar. 26, 1991

[54] SEMICONDUCTOR MEMORY DEVICE WITH FLASH WRITE MODE OF OPERATION

[75] Inventor: Sachiko Kamisaki, Tokyo, Japan

[73] Assignee: NEC Corporation, Tokyo, Japan

[21] Appl. No.: 381,901

[22] Filed: Jul. 19, 1989

[30] Foreign Application Priority Data

Jul. 19, 1988 [JP] Japan .................. 63-181023

[51] Int. Cl.⁵ .................. G11C 7/00; G11C 8/00
[52] U.S. Cl. .................. 365/189.01; 365/230.03; 365/189.05
[58] Field of Search .................. 365/189.01, 230.03, 365/230.08, 189.05

[56] References Cited

U.S. PATENT DOCUMENTS 4,879,692 11/1989 Tokushige .................. 365/230.03

Primary Examiner—Joseph A. Popek
Attorney, Agent, or Firm—Sughrue, Mion, Zinn Macpeak & Seas

[57] ABSTRACT

A semiconductor memory device according to the present invention has a flash write mode of operation as well as a usual single bit write mode of operation, and a flash write switch circuit is provided between a flash write data bus system and parts of data bit lines for concurrently transferring a flash write data bit to the parts of the bit lines prior to activating sense amplifier circuit coupled to the bit lines, so that flash write data bus system merely needs to swing the parts of the bit lines within a relatively small range, thereby allowing a driver circuit coupled to the flash write data bus system to be decreased in size.

4 Claims, 8 Drawing Sheets

SEMICONDUCTOR MEMORY DEVICE WITH FLASH WRITE MODE OF OPERATION

FIELD OF THE INVENTION

This invention relates to a semiconductor memory device and, more particularly, to a random access memory device with a flash write mode of operation where a data bit is concurrently written into a word of memory cells during a single access.

DESCRIPTION OF THE RELATED ART

A typical example of the semiconductor memory device is illustrated in FIG. 1 of the drawings, and comprises a memory cell array 1 accompanied with word lines W1, W2, .. and Wn and with bit lines B1, ... . and Bn, a row address buffer circuit 2 supplied with row address bits from the outside thereof, and a row address decoder circuit 3 coupled to the row address buffer circuit 2 and activating one of the word lines W1 to Wn. The row address buffer circuit 2 is coupled to a plurality of address pins AD1 to And, and the row address bits are supplied to the address pins AD1 to And together with column address bits. When the row address decoder circuit activates one of the word lines W1 to Wn, data bits are read out from memory cells coupled to the activated word lines, and are transferred to sense amplifier circuits through the bit lines for quick determination of the logic levels.

The semiconductor memory device further comprises a column address buffer circuit 5 supplied with the column address bits from the outside, a column switch circuit 6 associated with the sense amplifier circuits 4, and a column address decoder circuit 7 for steering the data bits through the column switch circuit 4. The data bit is relayed from the column switch circuit 6 to an input-and-output facility 8 which are provided with a plurality of latching circuits, and a part of the latching circuits is used for the flash write mode of operation. The input-and-output facility 8 is coupled to an input-and-output pin 9, and the data bit or data bits are transferred from or to the input-and-output pin 9. For providing various timings, a controlling unit 10 is incorporated therein, and the controlling unit 10 produces timing signals which define the read-out mode operation, a single bit write mode of operation and a flash write mode of operation. An activation signal for the sense amplifier circuits 4, a flash write mode selecting signal $\overline{FWM}$ of the active low voltage level and a column decoder enable signal DE are some of these timing signals. In this instance, the controlling unit 10 is supplied with external controlling signals such as a row address strobe signal $\overline{RAS}$ of an active low voltage level, a column address strobe signal $\overline{CAS}$ of the active low voltage level, a write enable signal $\overline{WE}$ of the active low voltage level and a flash write enable signal FW of an active high voltage level. For propagating data bits in parallel, a multiple-bit bus system 11 is provided between the input-and-output facility 8 and the column switch circuit 6, and a driver circuit (not shown) is provided in association with the multiple-bit bus system 11..

Description is hereinbelow made for the flash write mode of operation with reference to FIG. 2 of the drawings. The flash write mode of operation starts with the flash write enable signal FW of the active high voltage level at time t1. When the row address strobe signal $\overline{RAS}$ goes down to the active low voltage level (time t2), the row address bits on the address pins are stored in the row address buffer circuit 2, and are decoded by the row address decoder circuit 3 for activation of the selected word line at time t3. The selected word line allows the associated memory cells to put the data bits stored therein on the bit lines, and, accordingly, small differential voltage levels respectively take place on the bit lines at time t4. At time t5, the controlling unit 10 produces the activation signal which is supplied to the sense amplifier circuits 4 for activation thereof, so that the differences on the bit lines are increased in voltage values.

A plurality of data bits (which are hereinbelow referred to as "flash write data bits") of, for example, logic "0" level have been provided from the latching circuits of the input-and-output facility 8 to the multiple-bit bus system 11 before time t6. The controlling unit 10 is responsive to the flash write enable signal FW and, produces the flash write mode selecting signal $\overline{FWM}$ of the active low voltage level which are supplied to the column address decoder circuit 7. With the flash write mode selecting signal, the column address decoder circuit 7 activates all of the output signals thereof to the high voltage level at time t6, and, for this reason, the column switch circuit 6 becomes simultaneously transparent to all of the flash write data bits. Then, the flash write data bits on the multiple-bit bus system 11 are simultaneously transferred to the bit lines, and the bit lines are changed to the voltage level representative of logic "0" level at time t7. Thus, the bit lines are shifted to the voltage level of logic "0", and the data bits of logic "0" are simultaneously written into the memory cells coupled to the selected word lines.

In the flash write mode of operation, the column switch circuit 6 concurrently provides the conduction paths between the multiple-bit bus system 11 and the bit lines, and, for this reason, is arranged as shown in FIG. 3. In FIG. 3, the column address decoder circuit 7 largely comprises a column address decoding section 21 activated by the column decoder enable signal DE to shift one of the output signal lines thereof to the low voltage level and a group of two-input NAND gates 23, 24, 25, 26, ... and 27 associated with the output signal lines of the decoder section 21, respectively. The two-input NAND gates 23 to 27 are respectively coupled at first input nodes thereof to the output signal lines of the column address decoder section 21, and the second input nodes of the NAND gates 23 to 27 are commonly coupled to the controlling unit 10 for receiving the flash write mode selecting signal $\overline{FWM}$.

When the single bit write mode operation is established in the semiconductor memory device, the flash write mode selecting signal FWM remains in the inactive high voltage level, so that the NAND gates serve as inverter circuits to produce the complementary signals of the output signals of the column address decoder section 21. However, if the flash write mode of operation is established in the semiconductor memory device, the controlling unit 10 shifts the flash write mode selecting signal FWM to the active low voltage level, so that all of the NAND gates 23 to 27 produces the output signals of the high voltage level regardless of the output signals from the decoder section 21. Then, all of the switching units of the column switch circuit 6 simultaneously turn on to provide the conduction paths between the multiple-bit bus system 11 and the bit lines.

However, a problem is encountered in the prior art semiconductor memory device in that the column address decoder circuit occupies a large amount of real estate on the semiconductor chip in comparison with a semiconductor memory device without any flash write mode of operation. This is because of the fact that the NAND gates should be provided between the column address decoder section 21 and the column switch circuit 6. If only single bit write mode operation is established in the semiconductor memory device, the NAND gates 23 to 27 are replaceable with inverter circuits. In general, a NAND gate is twice as large in the number of component transistors as an inverter circuit, so that the column address decoder circuit responsive to the flash write mode of operation occupies a larger amount of real estate than the semiconductor memory device without any flash write mode of operation.

The driver circuit associated with the multiple-bit bus system 11 is also causative of increasing the semiconductor chip size. As described hereinbefore, the bit lines are simultaneously shifted to the voltage level representative of the flash write data bits after the differential amplifications of the data bits read out from the memory cells coupled to the selected word line. If the flash write data bits are opposite in logic level to the read-out data bits, the bit lines are full-swung between the high and low voltage levels, and, accordingly, the driver circuit should be equipped with large transistors to cope with the simultaneous full-swings of the bit lines.

Moreover, the prior art semiconductor memory device with the flash write mode of operation has another problem in undesirable noises produced in the flash write mode of operation. Namely, the column address decoder circuit 7 simultaneously shifts the output signal lines to the column switch circuit 6, and, accordingly, drives parasitic capacitances respectively coupled to the output signal lines as well as the gate capacitances of the switching units of the column switch circuit 6. The simultaneous shifting operation consumes a large amount of current, and, for this reason, undesirable fluctuations tend to be take place in the source of voltage levels. This results in the noises which are causative of mis-operations of the semiconductor memory device.

SUMMARY OF THE INVENTION

It is therefore an important object of the present invention to provide a semiconductor memory device with flash mode of operation which occupies a relatively small amount of the real estate on the semiconductor chip.

It is also an important object of the present invention to provide a semiconductor memory device with flash write mode of operation which is less liable to produce undesirable noises.

To accomplish these objects, the present invention proposes to provide a flash write switch circuit used in the flash write mode of operation only.

In accordance with the present invention, there is provided a semiconductor memory device having a read-out mode of operation, a single bit write mode of operation and a flash write mode of operation, comprising: a) a memory cell array having a plurality of memory cells arranged in rows and columns; b) a plurality of word lines coupled to the memory cells of the rows, respectively; c) a plurality of bit line pairs respectively coupled to the memory cells of the columns, respectively, and operative to propagate data bits in the form of differences in voltage level, respectively, the bit line pairs having first bit lines respectively paired with second bit lines; d) a row addressing facility supplied with row address bits and operative to activate one of the word lines for providing data paths between the bit line pairs and the memory cells coupled thereto; e) sense amplifier circuits respectively coupled to the bit line pairs and responsive to activation signals for increasing the differences in voltage level; f) an input-and-output data facility supplied with a single bit write data bit in the single bit write mode of operation and with a flash write data bit in the flash write mode of operation; g) an input-and-output data bus system coupled to the input-and-output data facility for propagating the single bit write data bit in the form of a difference in voltage level in the single bit write mode of operation; h) a flash write data bus system coupled to the input-and-output data facility for propagating the flash write data bit in the form of either high or low voltage level in the flash write mode of operation; i) a column addressing facility supplied with column address bits and operative to produce a multi-bit output signal in the single bit write mode of operation; j) a column switch circuit having a plurality of switching units respectively coupled between the bit line pairs and the input-and-output data bus system, and responsive to the multi-bit output signal to provide a data path between one of the bit line pairs and the input-and-output data bus system; k) a controlling unit supplied with external control signals including a flash write enable signal, and operative to produce internal control signals including the activation signals in every mode of operation and a flash write switch controlling signal in the flash write mode of operation; and 1) a flash write switch circuit having a plurality of switching units respectively coupled between the flash write data bus system and either of the first bit lines and the second bit lines, and responsive to the flash write switch controlling signal to simultaneously provide data paths therebetween.

BRIEF DESCRIPTION OF THE DRAWINGS

The features and advantages of a semiconductor memory device with flash write mode of operation according to the present invention will be more clearly understood from the following description taken in conjunction with the accompanying drawings in which.

DESCRIPTION OF THE PREFERRED EMBODIMENTS

First embodiment

Figure 1:
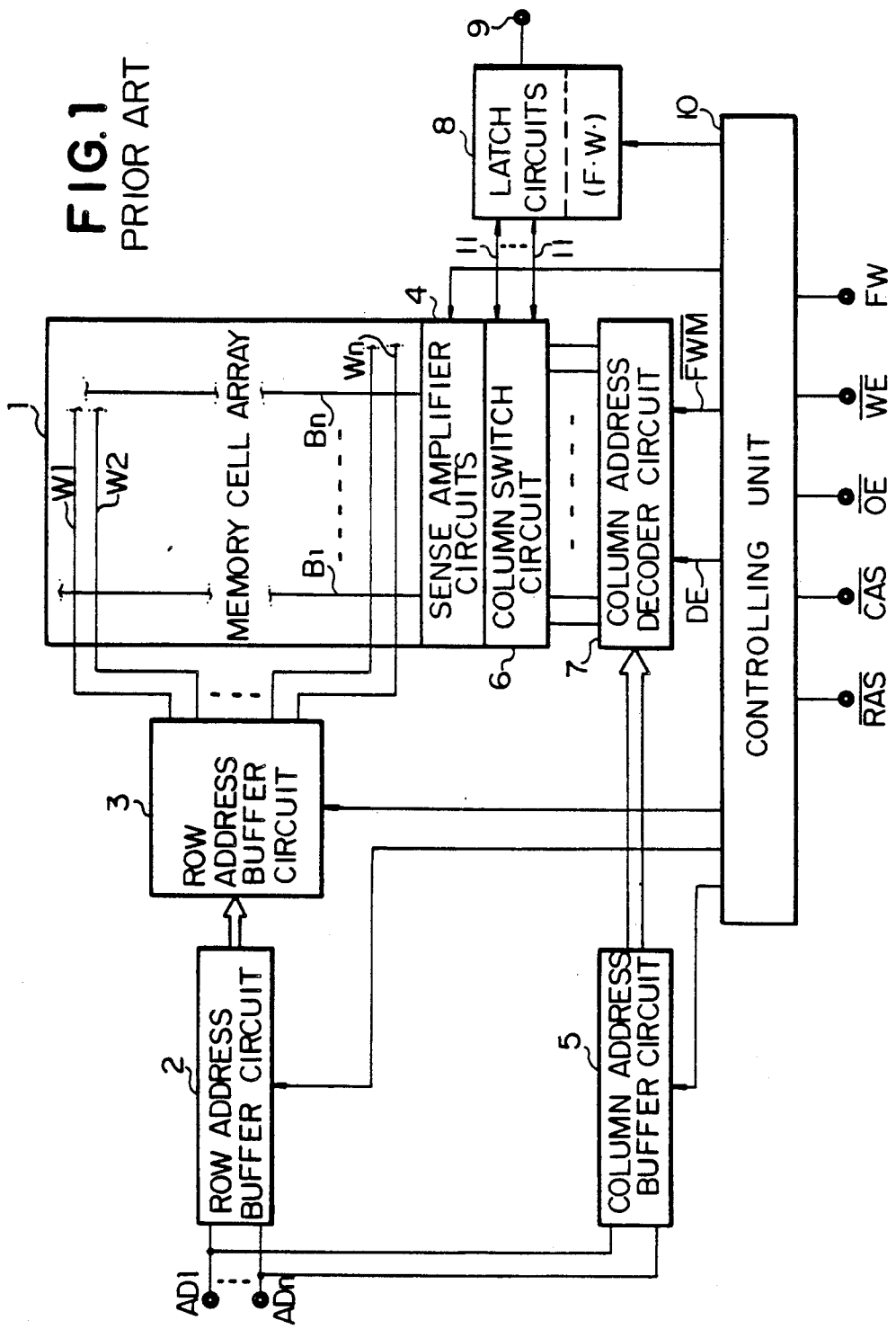
FIG. 1 is a block diagram showing the circuit arrangement of a prior art semiconductor memory device which is responsive to the flash mode of operation.
Figure 2:
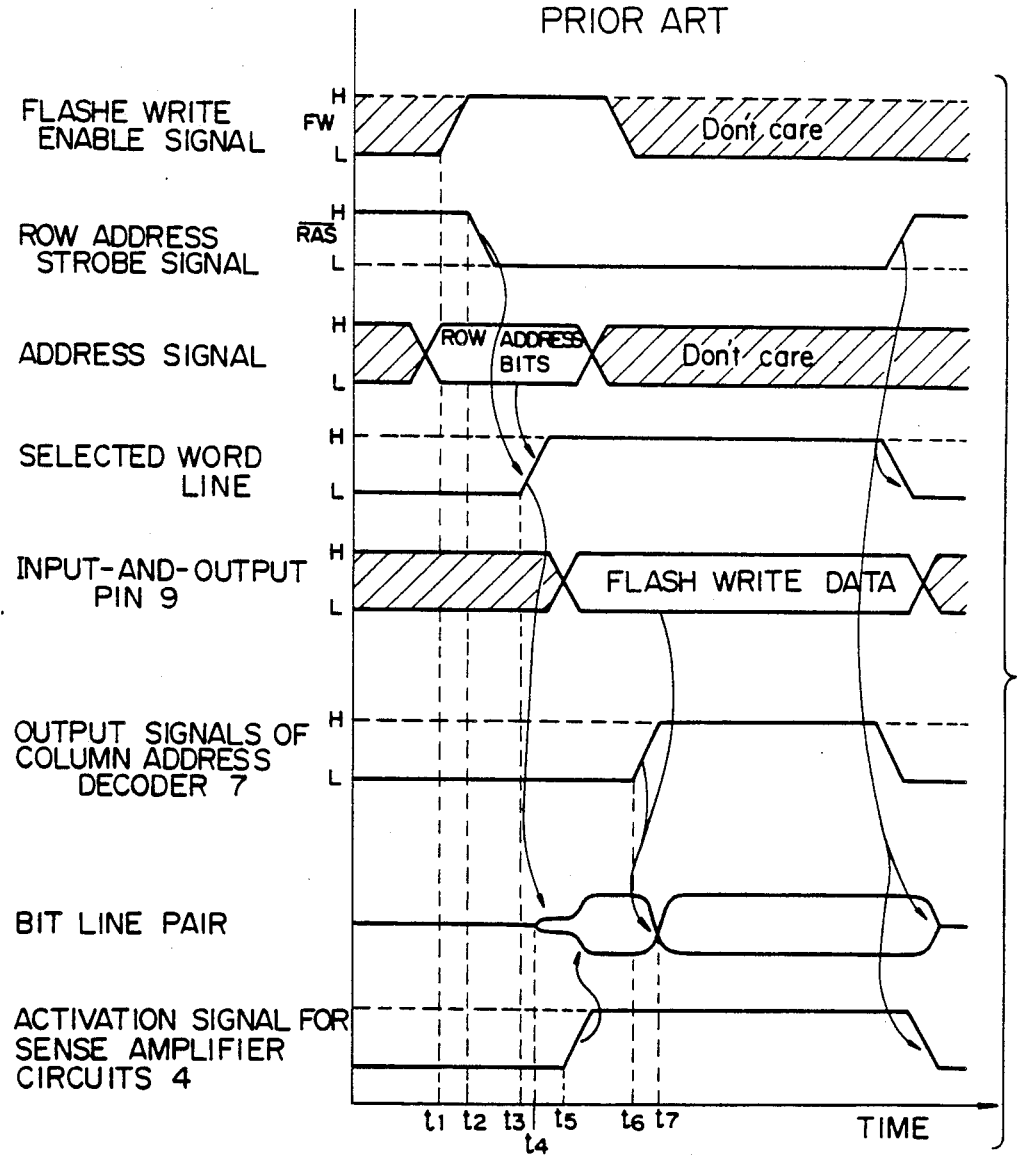
FIG. 2 is a diagram showing the waveforms of essential signals produced in the prior art semiconductor memory device in the flash write mode of operation.
Figure 3:
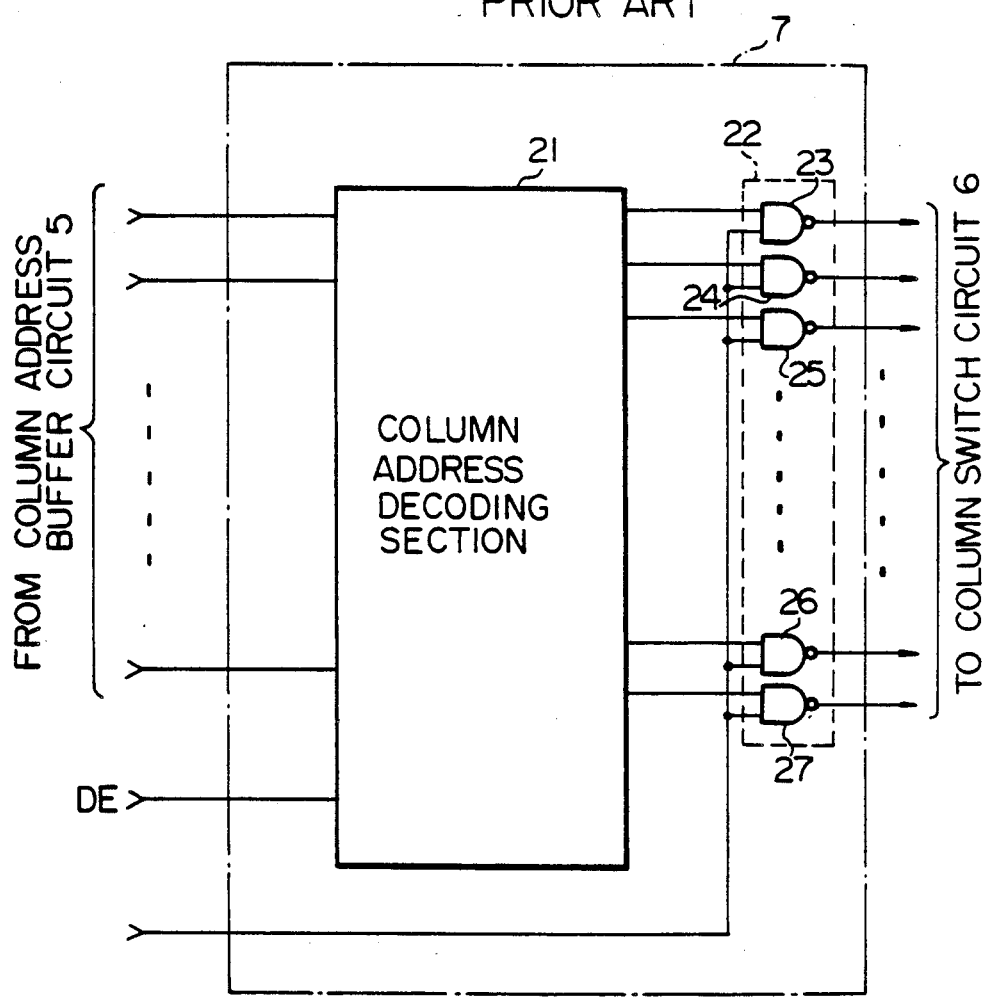
FIG. 3 is a circuit diagram showing the arrangement of the column address decoder circuit incorporated in the prior art semiconductor memory device shown in FIG. 1.
Figure 4:
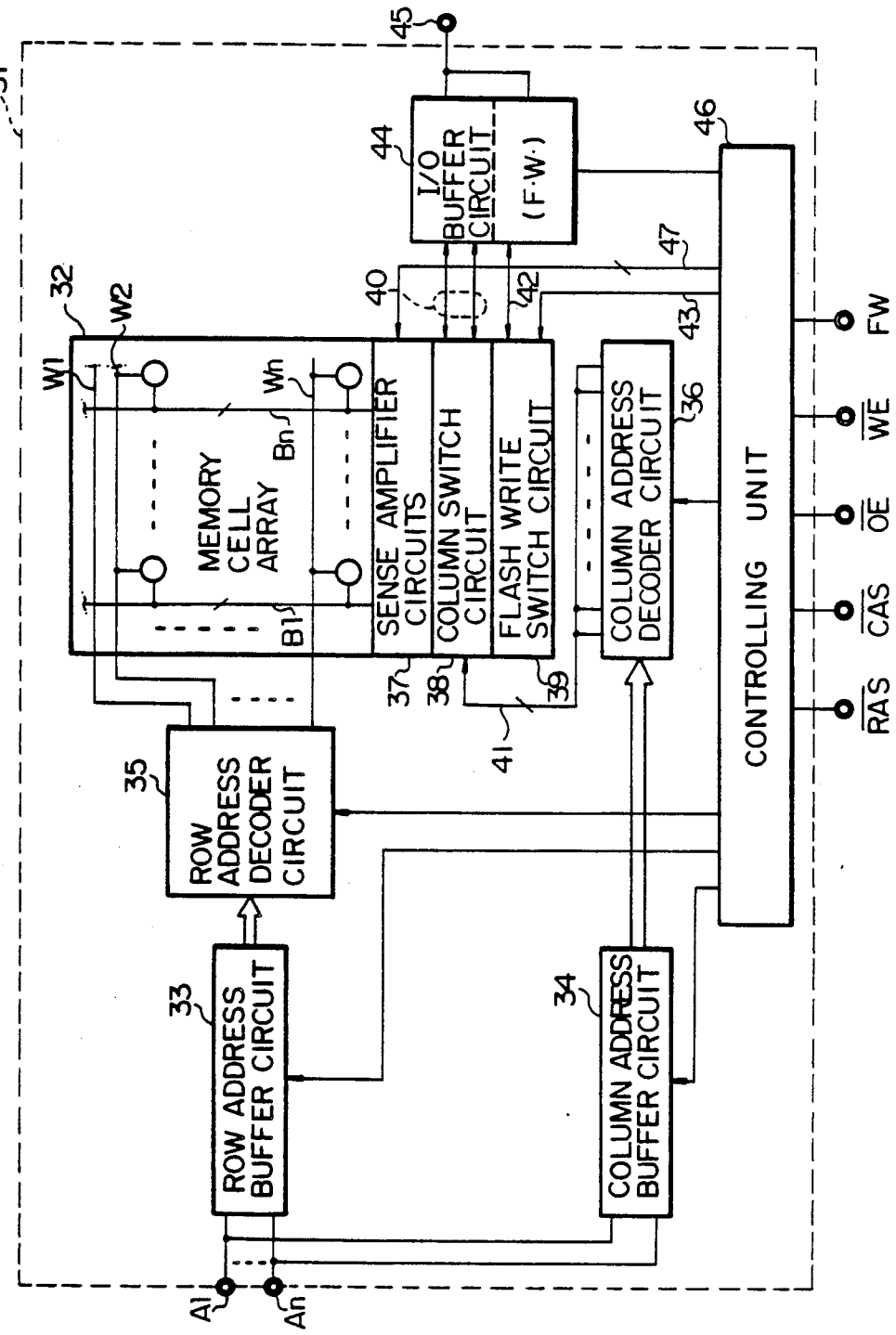
FIG. 4 is a block diagram showing the arrangement of a random access memory device embodying the present invention.

Referring first to FIG. 4 of the drawings, a random access memory device embodying the present invention is fabricated on a single semiconductor chip 31 and comprises a memory cell array 32 having memory cells arranged in rows and columns. Only four memory cells (each represented by a small circle) are shown in FIG. 4, however, a large number of random access memory cells are incorporated in the memory cell array 32. The memory cell array 32 is associated with a plurality of word lines W1, W2, . . . and Wn, and the word lines W1 to Wn are coupled to the memory cells of the plural rows, respectively. The memory cell array 32 is further associated with a plurality of bit line pairs B1 to Bn, and the bit line pairs B1 to Bn are respectively shared by the memory cells of the plural columns.

The semiconductor memory device is accompanied with a plurality of address pins A1 to An which are coupled to a row address buffer circuit 33 and to a column address buffer circuit 34. The row address buffer circuit 33 is associated with a row decoder circuit 35, and row address bits are transferred from the row address buffer circuit 33 to the row address decoder circuit so as to selectively activate the word lines W1 to Wn. Similarly, the column address buffer circuit 34 is coupled to a column address decoder circuit 36, and column address bits are supplied to the column address decoder circuit 36 for decoding operation.

The bit line pairs B1 to Bn are coupled to sense amplifier circuits 37 for rapidly increasing differences in voltage levels between each of the bit line pairs B1 to Bn and reference nodes, respectively. The bit line pairs B1 to Bn are further coupled in parallel to a column switch circuit 38 and a flash write switch circuit 39. The column switch circuit 38 has a plurality of switching units provided between the bit line pairs B1 to Bn and an input-and-output bus system 40, and the switching units are responsive to a multiple-bit output signal of the column address decoder circuit 36 on a signal lines 41. On the other hand, the flash write switch circuit 39 is provided with a plurality of flash write switching transistors coupled between the bit line pairs B1 to Bn and a flash write data line 42, and is controlled by a flash write switch control signal on a signal line 43. The input-and-output bus system 40 is coupled to an input-and-output buffer circuit 44 provided with a plurality of latching circuits, and the flash write data line 42 is coupled between the flash write switch circuit 39 and a part of the latching circuit of the input-and-output buffer circuit 44. The input-and-output buffer circuit 44 is provided in association with an input-and-output pin 45.

The random access memory device shown in FIG. 4 further comprises a controlling unit 46 which is supplied with external control signal and produces various internal control signals. The external control signals are row address strobe signal $\overline{RAS}$ of an active low voltage level, a column address strobe signal $\overline{CAS}$ of the active low voltage level, an output enable signal $\overline{OE}$ of the active low voltage level, a write enable signal $\overline{WE}$ of the active low voltage level and a flash write enable signal of an active high voltage level. The internal control signals includes the flash write switch control signal, activation signals of supplied through signal lines 47 for activation of the sense amplifier circuits 37, decoder enable signals supplied to the row address decoder circuit 33 and the column address decoder circuit 36 for activations thereof, latching signals supplied to the row address buffer circuit 33 and the column address buffer circuit 34 for providing latching timings, and an input-and-output control signal supplied to the input-and-output buffer circuit 44.

Figure 5:
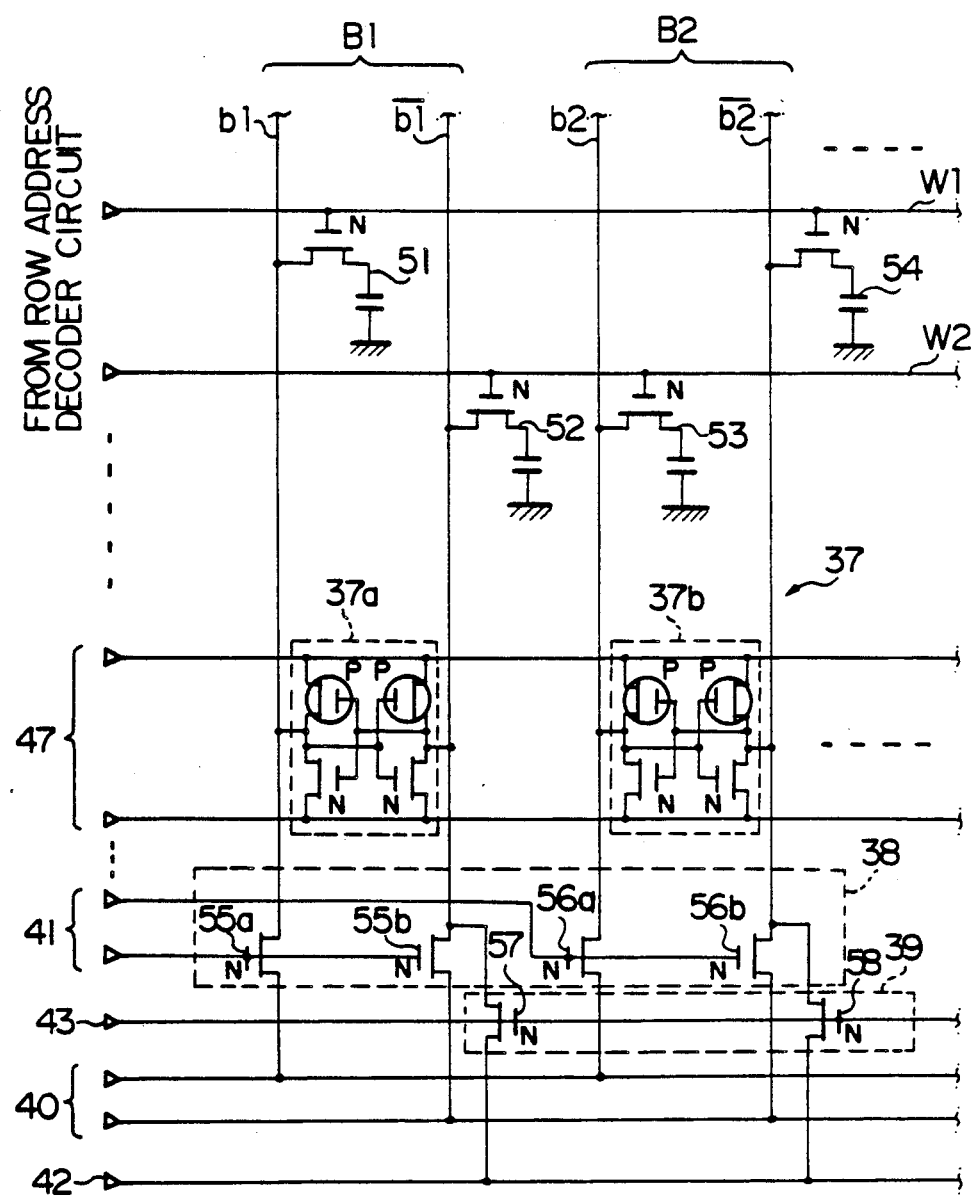
FIG. 5 is a circuit diagram showing an essential part of the random access memory device shown in FIG. 4.

Turning to FIG. 5 of the drawings, an essential part of the random access memory device shown in FIG. 4 is illustrated in detail. Each of the bit line pairs B1 to Bn consists of two bit lines b1 and $\overline{b1}$, b2 and $\overline{b2}$, . . . , and each of the bit lines is coupled to each column of the memory cells. The memory cells are of the one-transistor and one-capacitor type, and FIG. 5 merely shows four memory cells 51, 52, 53 and 54 respectively coupled to the bit lines b1 to $\overline{b2}$. The sense amplifier circuits 37a and 37b are coupled to the bit line pairs B1 and B2, and each of the sense amplifier circuits comprises two series combinations of p-channel type field effect transistors P and n-channel type field effect transistors N coupled between the two signal lines 47. The gate electrodes of the p-channel and n-channel type field effect transistors P and N are coupled to the common drain node of the other series combination in a cross-coupled manner, and, for this reason, the sense amplifier circuit can achieve the differential amplification on a small difference on the associated bit line pair.

The bit line pairs B1 to Bn are coupled to the input-and-output bus system 40 through the column switch circuit 38 as described hereinbefore, and the column switch circuit 38 comprises a plurality of switching units each consisting of two n-channel type field effect transistors 55a and 55b, 56a and 56b, . . . coupled between each bit line pair and the input-and-output bus system 40. The n-channel type field effect transistors of each switching unit are gated by one of the signal lines 41, and the data bits on the bit line pair are transferred through the switching unit to the input-and-output bus system 40.

On the other hand, the flash write switch circuit 39 comprises a plurality of flash write switching transistors 57, 58, . . . respectively coupled to the bit lines $\overline{b1}$, $\overline{b2}$, . . . only. The flash write data line 42 is shared by the flash write switching transistors 57, 58, . . . which are concurrently gated by the flash write switch control signal line 43. The flash write switching transistors 57, 58, . . . are thus concurrently shifted between the on-states and off states, and, accordingly, the flash write data bit on the data line 42 is transferred to all of the bit lines 51, $\overline{b2}$, . . . . In this instance, the flash write switching transistors 57, 58, . . . are coupled to the bit lines $\overline{b1}$, $\overline{b2}$, . . . , however, the flash write switching transistors 57, 58, . . . may be coupled to the bit lines b1, b2, . . . in another implementation. The flash write switch circuit 39 is formed by the switching transistors 57, 58, . . . equal in number to the bit line pairs B1 to Bn, and, for this reason, the total number of the flash write switch circuit 39 is smaller than the component transistors of the NAND gates 23 to 27. This results in reduction in occupation area.

Figure 6:
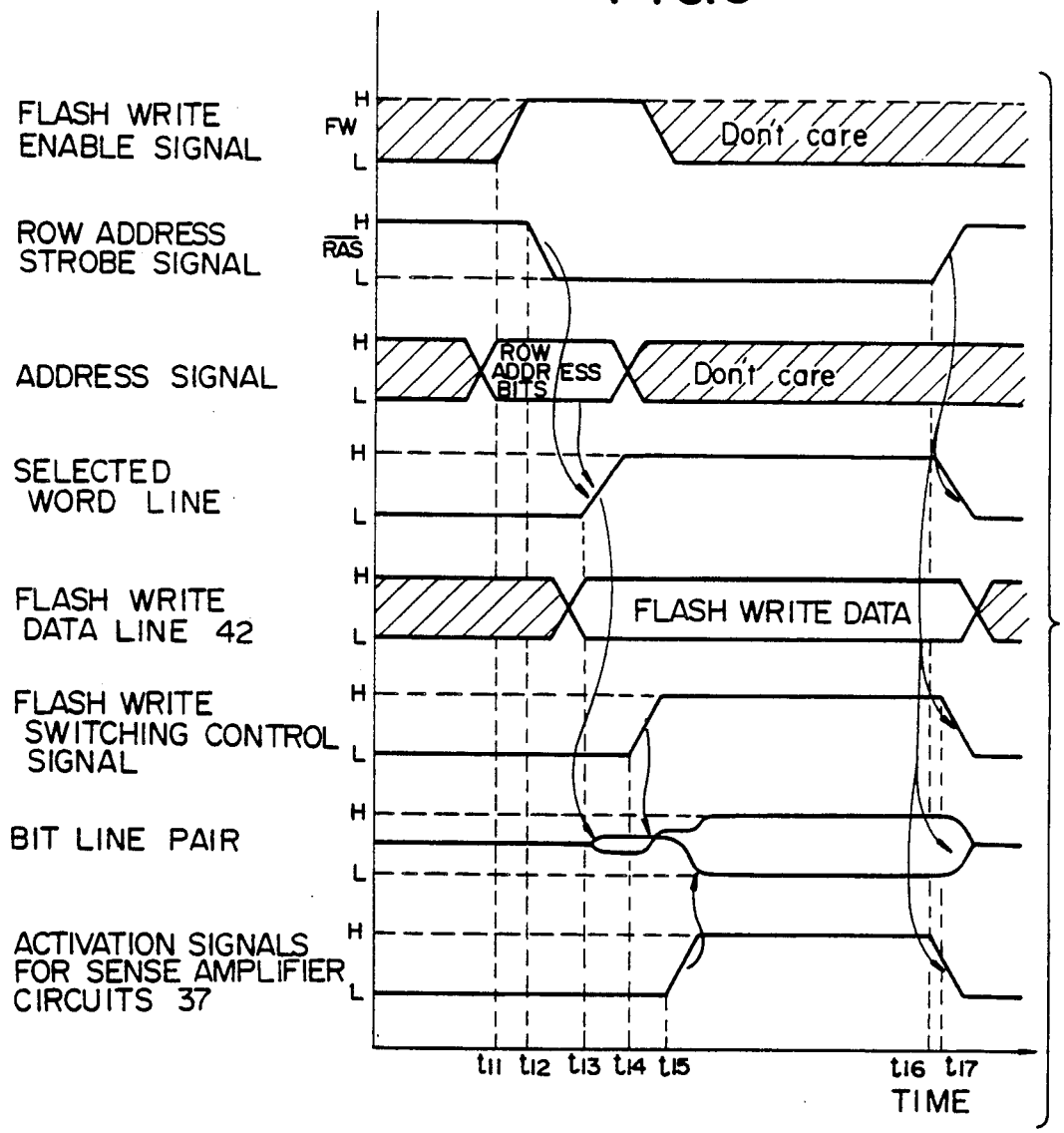
FIG. 6 is a diagram showing essential signals produced in the random access memory device shown in FIG. 4 in the flash write mode of, operation.

Description will be hereinbelow made for the flash write mode of operation as well as the single bit write mode of operation with reference to FIGS. 6 and 7, respectively.

Flash Write Mode of Operation

The flash write mode of operation starts with the flash write enable signal FW of the active high voltage level at time t11. At time t12, the row address strobe signal $\overline{RAS}$ goes down to the active low voltage level, and the row address bits are latched with the row address buffer circuit 33 and, then, transferred to the row address decoder circuit 35. With the row address bits, the row address decoder circuit 35 shifts one of the word lines into the active high voltage level at time t13, and the selected word line allows the data bits stored in the associated memory cells to appear on the bit line pairs B1 to Bn in the form of a small difference in voltage level. Since the flash write data bit has been already provided on the flash write data line 42, the flash write switch circuit 39 transfers the flash write data bit to the bit line $\overline{b1}$, $\overline{b2}$, ... in the presence of the flash write switching control signal at time t14. When the flash write data bit is transferred to the bit lines $\overline{b1}$, $\overline{b2}$, ..., the voltage levels on the bit lines $\overline{b1}$, $\overline{b2}$ ... are dominated by the logic level of the flash write data bit and, accordingly, are varied to the corresponding voltage level. Thus, the flash write data bit is transferred to the bit lines $\overline{b1}$, $\overline{b2}$, ... prior to the beginning of the differential amplification, a small driver circuit (not shown) associated with the data line 42 is enough to swing the voltage levels. The amount of the current are so small that any fluctuation is less liable to take place in the source of voltage level, and, accordingly, the semiconductor memory device is free from the noises due to the fluctuation in the source of voltage level.

After the flash write data bit is supplied to the bit lines, the activation signals are supplied from the controlling unit 46 to the sense amplifier circuits 37 at time t15. With the activation signals, the sense amplifier circuits 37 begin to carry out the differential amplifications for the flash write data bit, and, accordingly, large differences in voltage level each representative of the flash write data bit take place on the bit line pairs B1 to Bn. The flash write data bit are then written into the memory cells coupled to the data bits, $\overline{b1}$, $\overline{b2}$, .... If the flash write data bit is concurrently written into the memory cells, the row address strobe signal $\overline{RAS}$ and, accordingly, the selected word line are recovered to the inactive high voltage level and the inactive low voltage level, respectively, at time t16. Moreover, the flash write switching control signal and the activation signals are also recovered to the inactive levels around time t17.

Single Bit Write Mode of Operation

Figure 7:
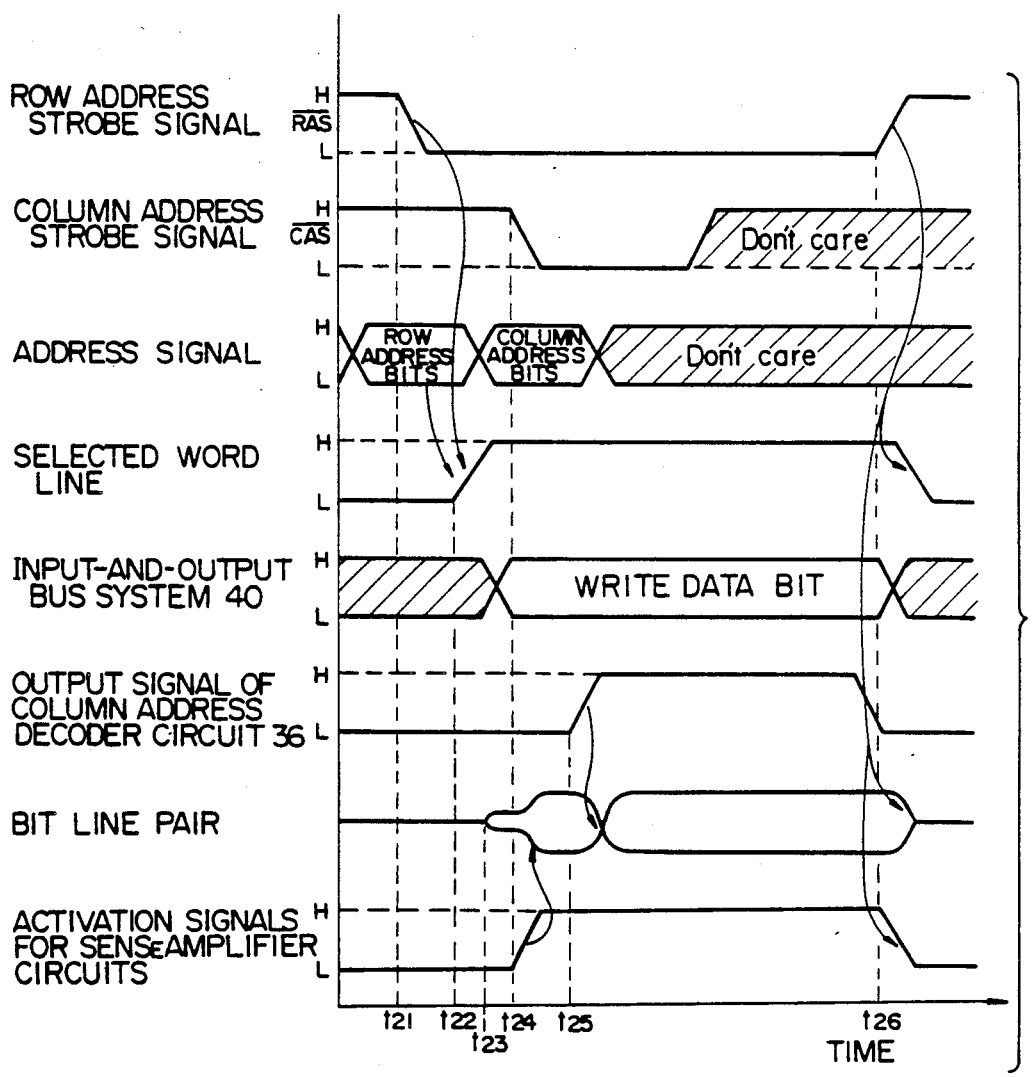
FIG. 7 is a diagram showing the essential signals in the single bit write mode of operation.

Turning to FIG. 7 of the drawings, the row address bits are latched into the row address buffer circuit 33 in the presence of the row address strobe signal $\overline{RAS}$ of the active low voltage level at time t21. The row address bits are transferred from the row address buffer circuit 33 to the row address decoder circuit 35, and, accordingly, one of the word lines is shifted to the active high voltage level at time t22. The data bits stored in the memory cells are read out on the bit line pairs B1 to Bn, and small differences in voltage level take place on the bit line pairs B1 to Bn around time t23. If the column address strobe signal $\overline{CAS}$ goes down to the active low voltage level at time t24, the column address bits are stored in the column address buffer circuit 34 and, accordingly, are transferred to the column address decoder circuit 36. The controlling unit 46 produces the activation signals for the sense amplifier circuits 37 and the decoder enable signal for the column address decoder circuit, so that the sense amplifier circuits 37 are activated to carry out the differential amplifications and the column address decoder circuit 36 produces the multiple-bit output signal. With the multiple-bit output signal from the column address decoder circuit 36, one of the switching units of the column switch circuit 38 turns on to provide conduction paths between the input-and-output data bus 40 and the selected bit line pair at time t25. Then, the single write data bit and the complementary bit thereof are memorized into the memory cells coupled to the selected bit line pair. The row address strobe signal $\overline{RAS}$ and the activation signals are recovered to the inactive voltage levels, respectively, around time t26, and selected word line is also recovered to the inactive low voltage level, thereby completing the single bit write mode of operation.

Second embodiment

Figure 8:
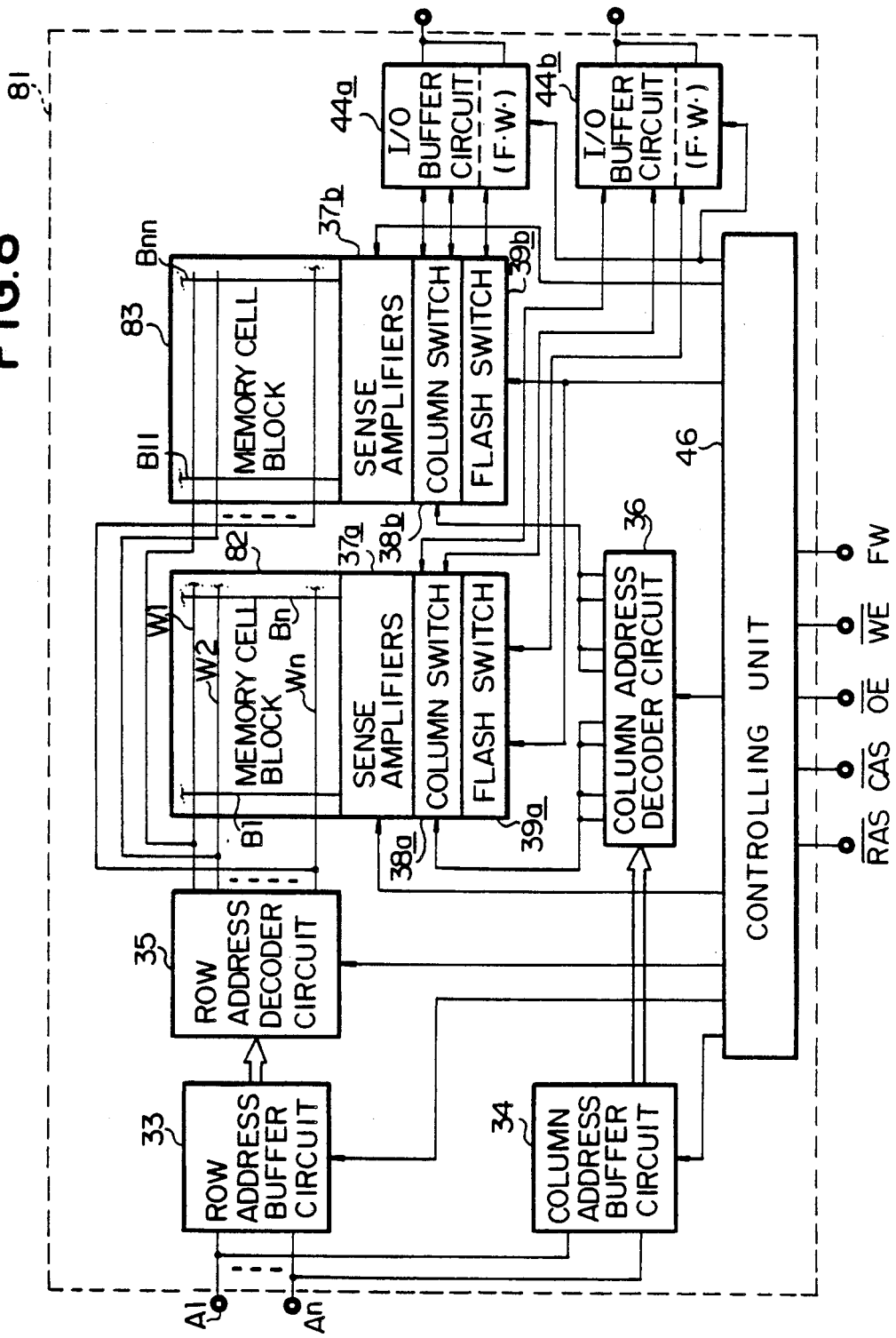
FIG. 8 is a block diagram showing the arrangement of another random access memory device embodying the present invention.

Turning to FIG. 8 of the drawings, another random access memory device embodying the present invention is illustrated and fabricated on a semiconductor substrate 81. A memory cell array incorporated therein is divided into first and second memory cell blocks 82 and 83, and, for this reason, the associated circuits are dualized. However, each of the dual associated circuits are similar in circuit arrangement to the corresponding circuits of the random access memory device shown in FIG. 4, so that the dual associated circuits are labeled with like reference numerals with small alphabetic letters a and b, respectively. The other component circuits are designated by like reference numerals used for the corresponding circuits in FIG. 4. The random access memory device shown in FIG. 8 thus dualizes the memory cell block as well as the associated component circuits, so that different flash data bits are written into the memory cell blocks 82 and 83, respectively. The circuit behavior is similar to that of the random access memory device shown in FIG. 4, and, for this reason, no description is incorporated for the sake of simplicity.

Although particular embodiments of the present invention have been shown and described, it will be obvious to those skilled in the art that various changes and modifications may be made without departing from the spirit and scope of the present invention.

What is claimed is:

1. A semiconductor memory device having a readout mode of operation, single bit write mode of operation and a flash write mode of operation, comprising:
   (a) a memory cell array having a plurality of memory cells arranged in rows and columns;
   (b) a plurality of word lines coupled to the memory cells of the rows, respectively;
   (c) a plurality of bit line pairs respectively coupled to the memory cells of the columns, respectively, and operative to propagate data bits in the form of differences in voltage level, respectively, said bit line pairs having first bit lines respectively paired with second bit lines;
   (d) a row addressing facility supplied with row address bits and operative to activate one of the word lines for providing data paths between the bit line pairs and the memory cells coupled thereto;
   (e) sense amplifier circuits respectively coupled to the bit line pairs and responsive to activation signals for increasing the differences in voltage level, thereby quickly deciding the logic levels of said data bits;

(f) an input-and-output data facility supplied with a single write data bit in the single bit write mode of operation and with a flash write data bit in the flash write mode of operation;

(g) an input-and-out-put data bus system coupled to said input-and-output data facility for propagating the single write data bit in the form of a difference in voltage level in the single bit write mode of operation;

(h) a flash write data bus system coupled to said input-and-output data facility for propagating the flash write data bit in the form of either high or low voltage level in the flash write mode of operation;

(i) a column addressing facility supplied with column address bits and operative to produce a multi-bit output signal in the single bit write mode of operation;

(j) a column switch circuit having a plurality of switching units respectively coupled between said bit line pairs and the input-and-output data bus system, and responsive to said multi-bit output signal to provide a data path between one of the bit line pairs and the input-and-output data bus system for transferring said single write data bit from said input-and-output data bus system to said one of the bit line pairs;

(k) a controlling unit supplied with external control signals including a flash write enable signal, and operative to produce internal control signals including and activation signals in every mode and operation and a flash write switch controlling signal in the flash write mode of operation; and (l) a flash write switch circuit having a plurality of switching units respectively coupled between the flash write data bus system and either of said first bit lines and said second bit lines, and responsive to the flash write switch controlling signal to simultaneously provide data paths therebetween for transferring and flash write data bit from said flash write data bus system to either of said first bit lines and said second bit lines.

2. A semiconductor memory device as set forth in claim 1, in which said flash write switch controlling signal is produced before said activation signals.

3. A semiconductor memory device as set forth in claim 2, in which said switching units are formed by field effect transistors, respectively.

4. A semiconductor memory device as set forth in claim 2, in which said memory cell array is divided into two memory cell blocks.

* * * * *

UNITED STATES PATENT AND TRADEMARK OFFICE
CERTIFICATE OF CORRECTION

PATENT NO. : 5,003,510
DATED : March 26, 1991
INVENTOR(S) : Sachiko KAMISAKI

It is certified that error appears in the above-identified patent and that said Letters Patent is hereby corrected as shown below:

Col. 1, line 22, delete "And" and insert --ADn--;

Col. 1, line 24, delete "And" and insert --ADn--;

Col. 6, line 53, delete "51" and insert --$\overline{b1}$--;

Col. 8, line 32, delete "a and b" and insert --$\underline{a}$ and $\underline{b}$--.

Signed and Sealed this

Twenty-fifth Day of August, 1992

Attest:

DOUGLAS B. COMER

*Attesting Officer*   *Acting Commissioner of Patents and Trademarks*